(12) United States Patent
Occchipinti et al.

(10) Patent No.: US 7,408,835 B2
(45) Date of Patent: Aug. 5, 2008

(54) OPTICALLY READABLE MOLECULAR MEMORY OBTAINED USING CARBON NANOTUBES, AND METHOD FOR STORING INFORMATION IN SAID MOLECULAR MEMORY

(75) Inventors: Luigi Occhipinti, Ragusa (IT); Michele Portico Ambrosio, Poggiomarino (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 744 days.

(21) Appl. No.: 10/374,664

(22) Filed: Feb. 25, 2003

(65) Prior Publication Data

US 2004/0027889 A1 Feb. 12, 2004

(30) Foreign Application Priority Data

Feb. 25, 2002 (EP) .................................. 02425099

(51) Int. Cl.
*G11C 8/00* (2006.01)
(52) U.S. Cl. ........................................ 365/234; 365/152
(58) Field of Classification Search ................ 365/151, 365/230.01, 215, 234, 152; 438/105
See application file for complete search history.

(56) References Cited

U.S. PATENT DOCUMENTS

| | | | |
|---|---|---|---|
| 6,128,214 A | 10/2000 | Kuekes et al. | |
| 6,430,511 B1 * | 8/2002 | Tour et al. | 702/19 |
| 6,438,025 B1 * | 8/2002 | Skarupo | 365/158 |
| 6,542,400 B2 * | 4/2003 | Chen et al. | 365/151 |
| 6,570,224 B1 * | 5/2003 | Ilyanok | 257/350 |
| 6,643,165 B2 * | 11/2003 | Segal et al. | 365/151 |
| 6,743,408 B2 * | 6/2004 | Lieber et al. | 423/447.1 |
| 6,756,795 B2 * | 6/2004 | Hunt et al. | 324/701 |
| 6,784,028 B2 * | 8/2004 | Rueckes et al. | 438/128 |
| 2001/0023986 A1 | 9/2001 | Mancevski | |
| 2002/0021460 A1 * | 2/2002 | Hansen | 359/1 |
| 2002/0084410 A1 * | 7/2002 | Colbert et al. | 250/306 |
| 2002/0106661 A1 * | 8/2002 | Virtanen | 435/6 |
| 2002/0130311 A1 * | 9/2002 | Lieber et al. | 257/1 |
| 2002/0197438 A1 * | 12/2002 | Hay et al. | 428/64.4 |
| 2005/0249656 A1 * | 11/2005 | Smalley et al. | 423/447.3 |

FOREIGN PATENT DOCUMENTS

| | | |
|---|---|---|
| DE | 100 32 412 A1 | 1/2002 |
| WO | WO 96/37888 | 11/1996 |
| WO | WO 98/39250 | 9/1998 |
| WO | WO 00/48195 | 8/2000 |
| WO | WO 01/03208 A1 | 1/2001 |

OTHER PUBLICATIONS

Scientific American vol. 82 (1994), J. Phys. Chem. B. vol. 103 (1999).
"Carbon Nanotube-Based Nonvolatile Random Access Memory for Molecular Computing", Science, vol. 389 (5476), Jul. 7, 2000, 94-97.
European Search Report for EP 02 42 5099 dated Jul. 16, 2002.

* cited by examiner

*Primary Examiner*—Thong Q Le
(74) *Attorney, Agent, or Firm*—Lisa K. Jorgenson; Bryan A. Santarelli; Graybeal Jackson Haley LLP

(57) ABSTRACT

Described herein is an optically readable memory device comprising a molecular memory obtained using carbon nanotubes. In particular, the molecular memory uses, as memory element, a bundle of carbon nanotubes, for which it is possible to obtain at least two stable states by modifying their geometrical configuration and, consequently, their optical transmission properties.

14 Claims, 8 Drawing Sheets

OFF　　　　　　　　　　　　ON

CONSTANT – CURRENT MODE

CONSTANT – HEIGHT MODE

OPTICALLY READABLE MOLECULAR MEMORY OBTAINED USING CARBON NANOTUBES, AND METHOD FOR STORING INFORMATION IN SAID MOLECULAR MEMORY

PRIORITY CLAIM

This application claims priority from European patent application No. 02425099.5, filed Feb. 25, 2002, which is incorporated herein by reference.

TECHNICAL FIELD

The present invention relates to a molecular memory, and, more specifically, an optically readable molecular memory, obtained using carbon nanotubes.

The present invention further relates to a method for storing information in said molecular memory.

BACKGROUND

At present, the nonvolatile memories with highest performance are Flash memories. Flash-memory technology was initially launched on the market as an alternative to EEPROM memories. Like EEPROM memories, Flash memories can be erased and reprogrammed electrically with generally high limits (~105 cycles) on the number of erase/write cycles. Unlike EEPROM memories, in a Flash memory there is no need to erase the entire memory array in order to store new data in a portion thereof. In fact, Flash memories are typically organized in sectors, each of which can be reprogrammed individually, with different access times for the read operation (~50 ns), the write operation (~5 µs) and the erase operation (~100 ms).

As is known, a Flash memory cell is basically made up of a bulk, an NMOS transistor provided in the bulk and comprising a drain region and a source region that are separate from one another, a control-gate region arranged over the bulk between the drain and source regions, and electrically insulated from the bulk by means of interposition of an insulating material, typically oxide, and a floating-gate region, arranged between the bulk and the control-gate region and electrically insulated therefrom. The floating-gate region is completely insulated from the external environment, and its potential depends upon the electrical charge present therein and upon the capacitive couplings with the other devices of the memory cell.

Furthermore, the memory cell is manufactured in such a way as to obtain a maximum capacitive coupling between the floating-gate region and the control-gate region, which, instead, can be contacted from outside.

The working principle of a Flash-memory cell is based upon the trapping of some electrons in the floating-gate region, the said electrons generating an electrical potential that compensates the electrical potential applied to the control-gate region, thus making it necessary to bring the latter up to a higher electrical potential to obtain a strong inversion in the channel.

In order to distinguish the two possible states (OFF/ON) of the memory cell, a voltage jump is required, which has the function of generating a variation in the threshold voltage of the MOS transistor. This variation determines a distinction between the state in which the floating-gate region does not contain any charge, characteristic of a virgin memory cell or an erased memory cell (represented by a logic "1"), and the state in which the floating-gate region contains a negative charge, characteristic of a programmed memory cell (represented by a logic "0").

The operation of programming a flash-memory cell envisages the creation of a channel for the electrons in the space-charge area of the drain region, the so-called "pinch-off area", in order to supply a certain number of electrons with the energy necessary to overcome the potential-energy barrier of the oxide-silicon interface. In this case, by applying an appropriate electrical field, it is possible to favor the migration of these electrons to the floating-gate region, storing on the latter a negative charge. This technique is commonly known as "channel-hot-electron (CHE) injection".

In flash memories, the erase operation, which consists of removing electrons from the floating-gate region, is obtained by the tunnel effect through the gate oxide, also known as the Fowler-Nordheim. (FN) effect. In this type of memory, erasure by bytes cannot be obtained. As is known, in face, in a typical array architecture of a flash memory, the source regions of all the memory cells are connected to the same common source line, the drain terminals of the memory cells belonging to the same column are connected to the same bit line, and the gate terminals of the memory cells belonging to the same row are connected to the same word line, so that, during the erase operation, all the memory cells belonging to a given sector are simultaneously erased. The capacity of non-volatile memories is strictly linked to the dimensions of the memory cells, which form the array, and to the complexity of the structure, whilst the dimensions of the memory cells are, in turn, strictly linked to the dimensions of the elementary electronic devices that form them.

In the last few years, the substantial success of CMOS technology has been determined basically by the possibility of constantly reducing the size of electronic devices. In fact, this technology follows the so-called Moore's law, according to which the number of the transistors that can be manufactured on an integrated circuit and, hence, the computing speed should double in a time range of between 18 and 24 months.

However, it is a common conviction that conventional silicon microelectronics will not be able to continue indefinitely to follow this law, in so far as sooner or later physical limits will certainly be reached that will prevent current circuits from functioning reliably at nanometric dimensions, whereas, at the same time, an exponential increase in production costs will render any further increase in the levels of integration prohibitive. In fact, as the density of the-electronic devices on a chip increases, phenomena such as the need to dissipate the heat generated by such densely populated circuits, and the transition from the classical behavior to the quantistic behavior of the charge carriers will considerably slow down progress.

The need to solve these problems has pushed research towards the study of new technologies, based upon the use of organic materials that will be able to replace either completely or partially silicon in the fabrication of electronic devices.

In fact, molecular electronics affords the potential for overcoming the limits of on-silicon technology, in so far as it is possible to manufacture single-molecule devices which are organized in parallel by means of self-assembly techniques that are also economically advantageous.

In particular, whilst it is possible, with current technologies, to manufacture high-density Flash memory units with capacities in the region of 64-128 Mb, but with high costs, in future, by resorting to molecular memories, it will be possible to achieve memory capacities of various tens or hundreds of gigabits, in which each memory cell will be formed by one or more molecules, the structural configuration of which may be associated with different possible and modifiable states by means of interactions at an atomic level or at the level of individual electrons.

In recent studies, it has been shown that it is possible to manufacture a non-volatile memory device using a particular protein, rhodopsin. The rhodopsin bacterium, for example, is a photochromic molecule, i.e., a molecule that is able to change color, and hence absorption spectrum, following upon exposure to photons of an appropriate wavelength. In the photocycle of the protein, shown in FIG. 1, two states are distinguishable, designated by bR and Q, which represent, respectively, the logic states "0" and "1". Furthermore, in FIG. 1, represented by the solid line, are the thermal relaxations, whilst, represented by the dashed line, are the transitions induced by light.

An article appearing in Scientific American Vol. 82 (1994), J. Phys. Chem. B. Vol. 103 (1999) describes the manufacture of electro-optical biomemories, which are based upon the rhodopsin bacterium, in which the reading and writing system employs two laser arrays arranged orthogonally to one another, and a detector array.

For writing the data, a yellow paging laser is used to bring the molecules into the logic state "0". A spatial light modulator (SLM), which is a liquid crystal display (LCD) array, partitions this beam, so as to excite a two-dimensional surface of material inside the transparent envelope. This surface of optically stimulated material represents the equivalent of a data page.

Before the protein returns to its initial state, a red laser is activated, arranged perpendicular to the yellow laser used for writing the data. Another spatial light modulator displays the binary data and sections this beam so as to display light spots on the page. The molecules arranged at the spots go into the Q-state and represent the logic states "1" on the page. The remaining molecules of the page return to the initial state and represent the logic state "0".

Reading of the data is also obtained optically, by activating the yellow laser, which excites the page upon which the yellow light impinges to the logic state "0". This operation is performed with the purpose of further differentiating the absorption spectra of the states that encode the logic "0" and the logic "1". After 2 ms, the page is impinged upon by a low-intensity red laser, the latter condition being required to prevent any jump into the Q state. The molecules that encode the logic "0" absorb red light, whilst the molecules that encode the logic "1" allow themselves to be traversed by the light beam. In this way, on the charge-injection photodetector array (CID), there is reconstructed an image, formed by light spots and dark spots, corresponding to the information contained in the memory in the form of binary data.

In order to erase the information, a short pulse of blue laser light suffices to convert the molecules from the Q state to the bR state.

This type of optically readable molecular memory presents a number of advantages over traditional semiconductor memories, these advantages being offset, however, by a number of limitations. In the first place, it is possible to produce, in large quantities and at a low cost, the protein on which a molecular memory of this type is based, with performance levels that are very similar to those of traditional semiconductor memories. In addition, the system can be integrated in a high-density architectural configuration, the minimum dimensions of which chiefly depend upon the quantity of biomolecules sufficient for guaranteeing operation, on a statistical basis, of the rhodopsin-bacterium photochromic system.

The limits of memories of this type are prevalently linked to the integratability of the biological material with the silicon and with the cleanroom process steps. In particular, there may arise problems connected to the stability of the protein/silicon link and to the conformational and hence functional stability of the proteins themselves at the interface with the silicon. In addition, a molecular memory that employs the rhodopsin bacterium would have access times in writing and erasure of the order of some milliseconds for a single cell.

Once again, in the framework of biomemories of the type described above, molecular-memory devices have been proposed, which use different types of molecules (rotaxane, pseudo-rotaxane, catenane). In particular, a memory of this type is described in the U.S. Pat. No. 6,128,214, granted on Oct. 3, 2000 in the name of Hewlett-Packard.

Broadly speaking, the above memory device, which is illustrated in FIG. 2, is formed by two parallel layers of nanometric conductors arranged perpendicular to one another, between which there is interposed a layer of molecules. A bistable molecule is arranged in a position corresponding to each intersection of the pairs of conductors and defines, in effect, a switch. An applied voltage modifies the electronic state of the molecules and, hence, the resistance between the top conductor and the bottom conductor. The switches are activated by electrochemical oxidation or reduction of the molecules. When a switch is closed electrochemically, the resistance between the connected conductors is low, and this state constitutes a logic "1". When the switch is open, the resistance is high, and this state represents a logic "0". In order to read the state of the switch, it is necessary to apply another voltage, the value of which is such as motto cause switching of the state of the junction. Consequently, the reading process is not destructive.

The limits of the above device are basically linked to the difficulty of arranging the molecules in contact with the nanometric conductors, which are made of silicon or metal, as well as to the instability of the molecules themselves to high temperatures.

In order to overcome the drawbacks of the molecular memories described above, in the article "Carbon Nanotube-Based Nonvolatile Random Access Memory for Molecular Computing", Science, Vol. 389 (5476), Jul. 7, 2000, 94-97, there is proposed the manufacture of nonvolatile memories based upon the use of molecular structures known as carbon nanotubes (CNTs).

It is known that carbon atoms have the property of organizing themselves to form different structures, giving rise to materials of different forms. In fact, a diamond is formed by carbon atoms organized in tetrahedrons, whilst graphite is formed by carbon atoms organized in planar structures. Consequently, these two allotropic forms, albeit originating from the same type of atoms, exhibit structural properties (hardness, elasticity, friction) and functional properties (electrical conductivity, color, etc.) that are highly different and frequently opposite to one another. The structural characteristics, such as hardness and refractoriness, of graphite and diamond render hard to implement, on a device, at nanometric scales, a top-down approach, through which it is possible to arrive at the desired dimensions with successive removal of a macroscopic quantity of a material. Instead, a bottom-up approach, through which it is possible to manufacture, and subsequently assemble, nanoscopic components, starting from individual atoms or molecules, is rendered possible by the use of another allotropic form of carbon, namely fullerene.

Belonging to the family of the fullerenes $C_{60}$, also known as buckyball, which presents a molecular structure having the shape of a polyhedral cage, consisting of pentagons and hexagons. The buckyball structures that develop as long cylinders, rather than as spheres, are called carbon nanotubes. Their length may be millions of times longer than their diameter. In addition, using known techniques of molecular synthesis, there have been observed, in the laboratory, single-walled cylindrical structures (single-walled nanotubes—SWNTs), having a diameter of 1-2 nm, and multiple-walled structures (multiple-walled nanotubes—MWNTs), i.e., formed by coaxial cylinders with diameters of a few tens of nanometers.

Carbon nanotubes are organic molecules formed by a number of interconnected carbon atoms in a cylindrical structure, characterized by a small weight, and they present exceptional elastic properties, which render them extremely hard, but also capable of undergoing large deformations without breaking. Thanks to their exceptional property of conducting electrical charges, carbon nanotubes, since they can be configured both as conductors and as semiconductors, are suitable for forming components of a new class of nanometric electronic devices.

A nanometric electronic device is described in the above-mentioned article and is shown in FIGS. 3a and 3b. The nanometric electronic device essentially consists of a substrate (for example, doped silicon) on which nanotubes are arranged in two different levels orthogonally with respect to one another and vertically separated by a distance of 1-2 nm, in such a way as to cross at a point corresponding to each memory element. Arranged between the conductive substrate and the first level of nanotubes is a dielectric (for example, silicondioxidee, $SiO_2$), with the purpose of insulating the second level of nanotubes from the substrate, which is polarized with a reference voltage (ground). Moreover, the nanotubes of the second level are arranged on top of spacers made of (organic or inorganic) dielectric material, so as to be insulated from the nanotubes of the first level. Instead, no dielectric is interposed at the points where the nanotubes of the second level and the nanotubes of the first level cross.

The nanotubes are then connected to the rest of the circuit, outside the grid, by means of contacts, made, for example, of gold, These contacts being used both during reading and during writing. In particular, writing of the single memory element is performed by imposing an electrostatic action between the substrate and the point of crossing of the two nanotubes, through the dielectric.

The voltage values imposed depend upon the thickness of the dielectric and upon the energy levels required for guaranteeing a change of state of the nanotube (ON/OFF), in such a way that such changes will be reversible. The OFF and ON states for the individual memory element are shown in FIGS. 4a and 4b, respectively. In particular, a voltage value of 4.5 V for the ON state and a value of 20 V for the OFF state have been estimated.

Consequently, reading of the individual memory element would be done electrically, always by means of the electrical contacts arranged on the edge of the grid, by measuring the resistivity associated to the two states ON/OFF.

The main limitations which, at the moment, prevent industrial development of the above approach are outlined in what follows.

A first limitation is represented by the fact that the techniques used for the manufacture of said architecture do not enable control of the nature of the nanotubes used. In particular, there will be a random distribution of metallic nanotubes (M) and semiconductor nanotubes (S). This implies that, in the read step, the values of resistivity measured on different cells that are in the same state, ON or OFF, undergo, even important, fluctuations according to the geometrical configuration (chirality) of the two nanotubes concerned. For instance, the crossings between nanotubes M-M, S-M, M-S, S-S are possible, to which different levels of resistivity are associated, corresponding both to the ON state and to the OFF state, even though the levels of resistivity for the two states ON-OFF remain, basically, distinguishable.

A second limitation, which may prevent operation of the nonvolatile memory architecture described herein, is represented by the possibility that, during reading operations, current paths are set up, which are able to falsify the interpretation of the state of an individual cell. This problem is known, and occurs, for example, in optical scanning systems of a matrix type. By way of example, FIG. 5 illustrates a schematic circuit diagram in which acquisition of the state is in effect falsified, as a result of the multiple paths of the current Generally speaking, this problem is solved using rectifying diodes connected in series to each sensing element so as to prevent the diodes from being traversed by reverse currents. In the case in point, this possibility would risk markedly influencing the complexity of the system, i.e., the final storage capacity, unless the rectification functions can be integrated by acting directly on the metal-semiconductor characteristics of the nanotubes. In this way, it would be possible to generate Schottky junctions, already integrated in the cell array.

A third limitation is represented by the fact that the configuration entails the manufacture, arrangement, and manipulation of individual nanotubes, appropriately organized and insulated from the rest of the structure. This operation is very difficult, as well as being costly, in so far as the products of the processes of synthesis are, generally speaking, bundles of nanotubes, and the extraction of a single molecule from the bundle would involve additional process steps, together with the manipulation of the molecules.

SUMMARY

The purpose of one embodiment of the present invention is, therefore, to provide an optically readable molecular memory which uses carbon nanotubes and to provide a method for storage of information in said molecular memory, which will enable the drawbacks of the storage devices according to the known art to be overcome.

BRIEF DESCRIPTION OF THE DRAWINGS

For a better understanding of the present invention, there is now described a preferred embodiment thereof, purely by way of non-limiting example, with reference to the attached drawings, in which.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention as defined by the appended claims. Thus, the present invention is not intended to be limited to the embodiments shown, but is to be accorded the widest scope consistent with the principles and features disclosed herein.

An innovative idea underlying an embodiment of the present invention is to provide an optically readable molecular memory which uses, as memory element, a bundle of carbon nanotubes, for which it will be possible to obtain at least two stable states by modifying their geometrical configuration, and, consequently, their optical transmission properties.

In fact, the geometrical characteristics of the carbon nanotubes markedly affect their electrical and optical properties.

Figure 1:
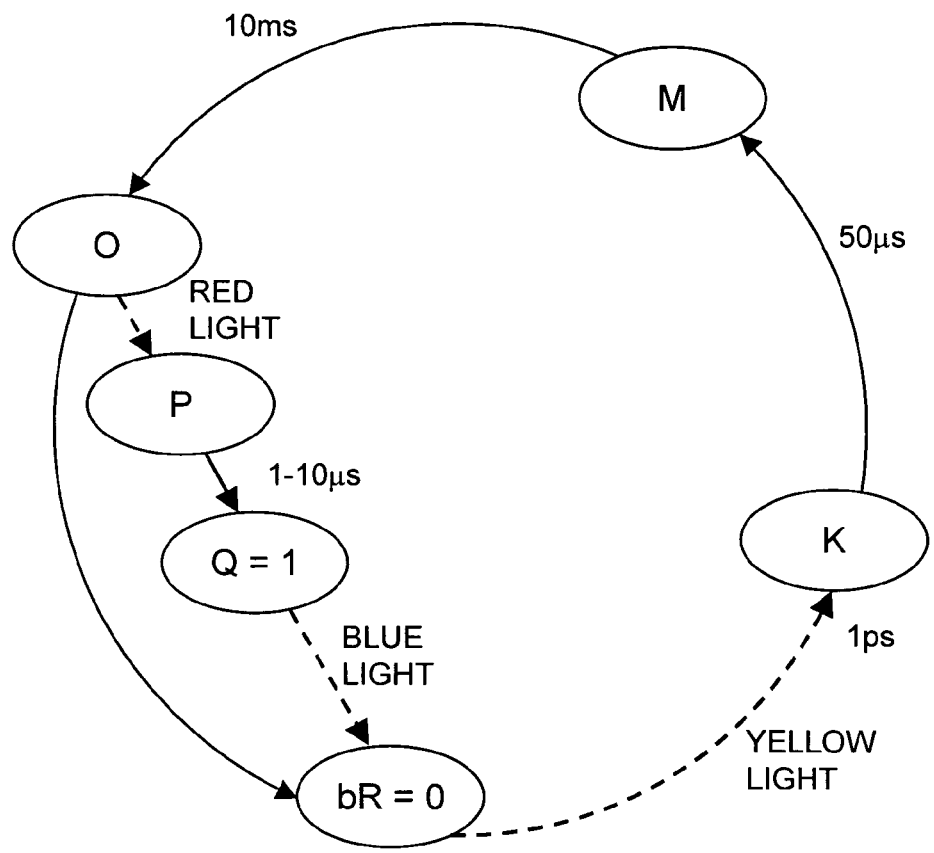
FIG. 1 shows the photocycle of the rhodopsin bacterium.
Figure 2:
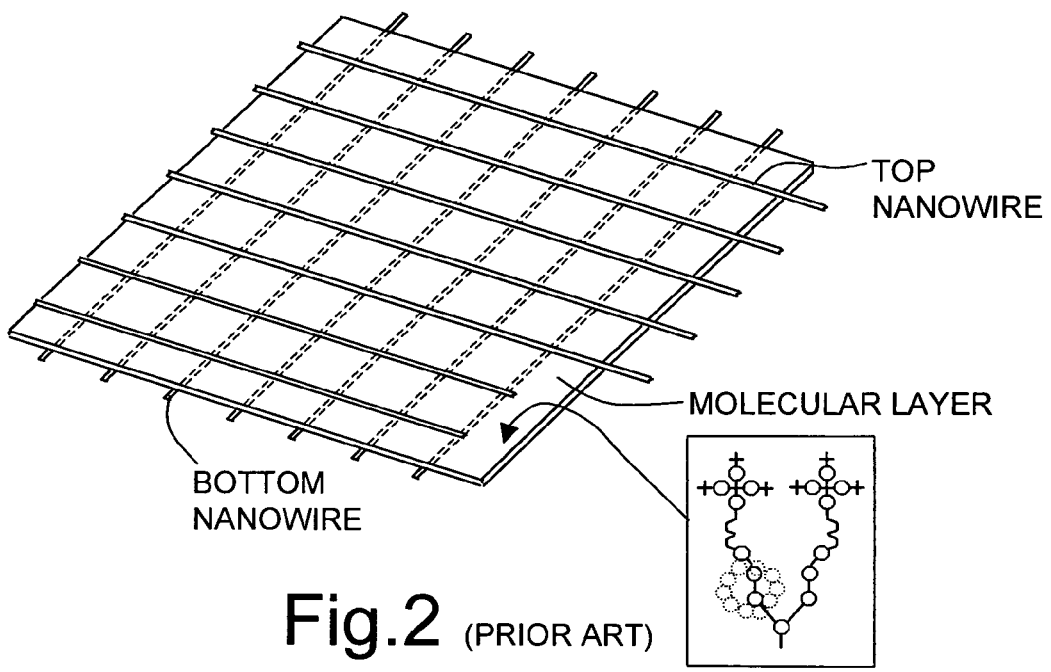
FIG. 2 shows the architecture of a molecular memory which uses different types of molecules.
Figure 3A:
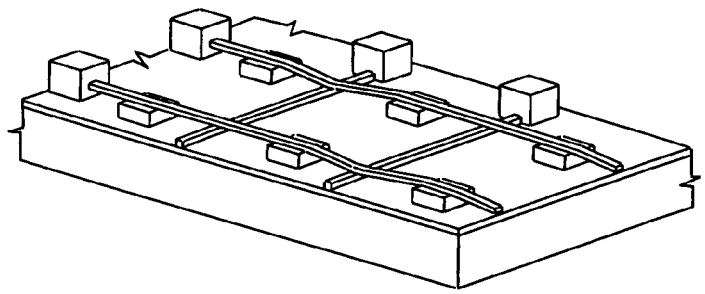
FIGS. 3a and 3b show the architecture of a nonvolatile memory using carbon nanotubes according to the prior art.
Figure 3B:
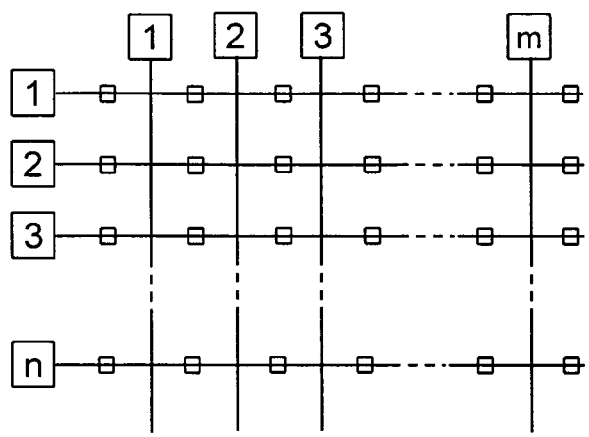
Figures 4A, 4B:
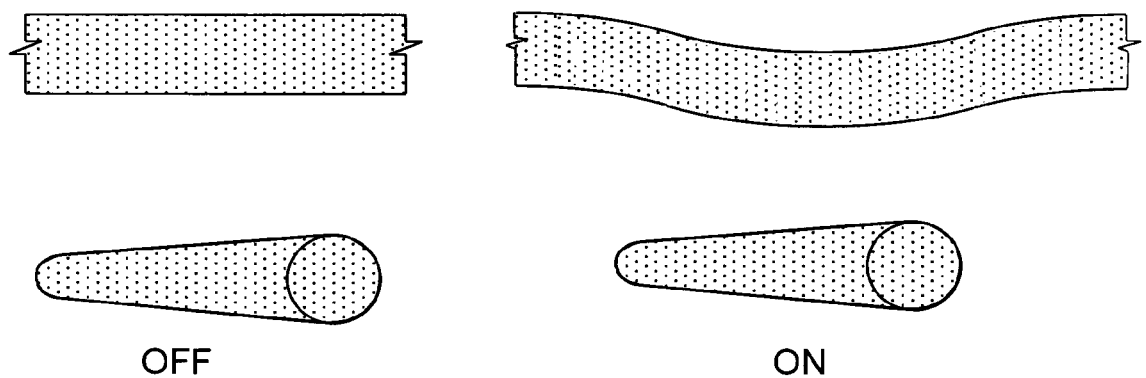
FIGS. 4a and 4b show a schematic representation of ON and OFF states of a memory element of the memory of FIGS. 3a and 3b.
Figure 5:
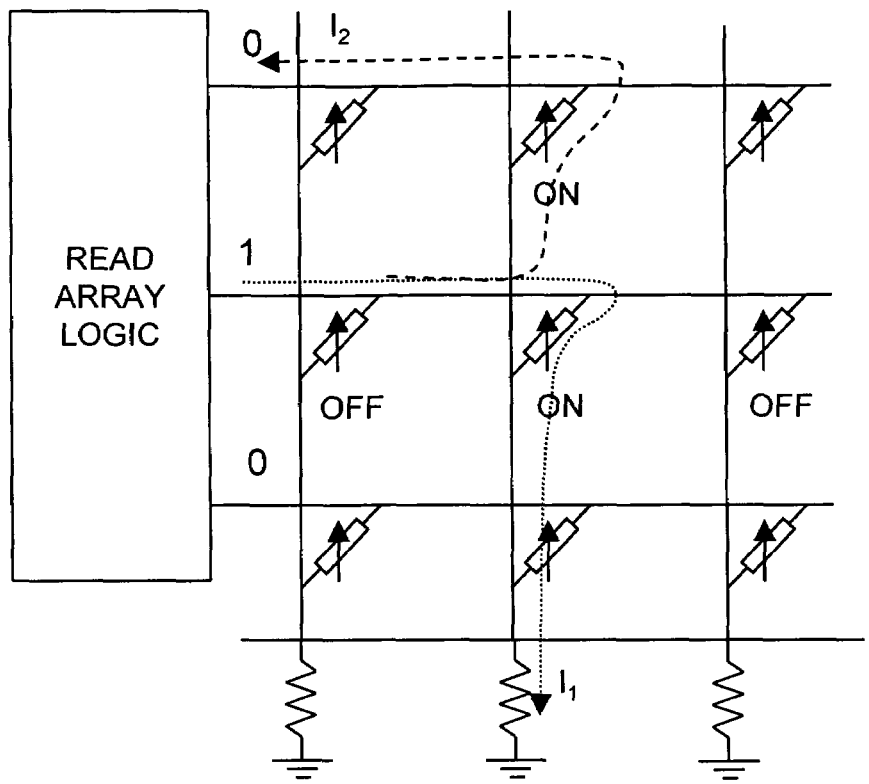
FIG. 5 shows a schematic representation of how a falsified reading, caused by the presence of multiple current paths, can occur in the nonvolatile memory of FIG. 3.
Figure 6:
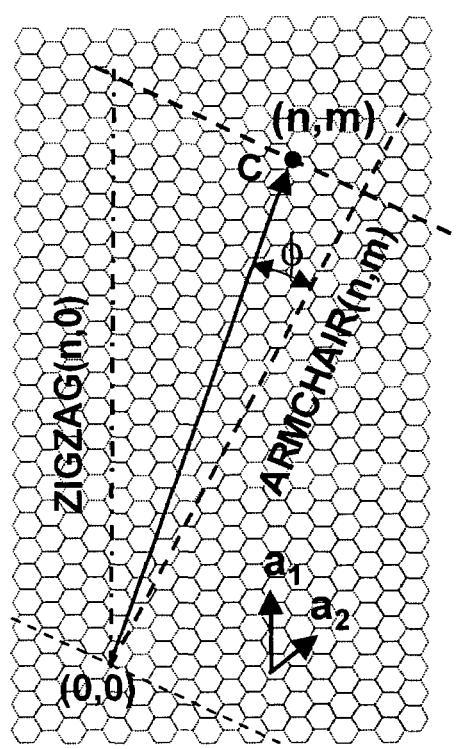
FIG. 6 shows the characterization of the geometry of a carbon nanotube through the chiral vector.

Carbon nanotubes have different shapes, which can be described by a vector, called chiral vector C, as illustrated in FIG. 6.

In particular, in geometrical terms, a carbon nanotube (CNT) can be obtained from a sheet of graphite, by "cleaving" it along the dashed lines perpendicular to the chiral vector, and "rolling" it up in the direction of the chiral vector itself. In this way, there is formed a cylinder of diameter $d=|C|/\pi$. The chiral vector C can be set in relation to two unit vectors, designated by $a_1$ and $a_2$, by means of two indices n and m, according to the following equation:

$$C = na_1 + ma_2.$$

Linked to the above indices n and m are n angle $\phi$, called chiral angle, and the diameter d of the nanotube, according to the following equations:

$$\phi = \arccos\left[\sqrt{3}(n+m)/2\sqrt{(n^2+m^2+nm)}\right]$$

$$d = \frac{a}{\pi}\sqrt{n^2+m^2+nm}$$

The values of n and m define the chirality of the nanotube. In particular, the co-ordinates (n; 0) and (n; n) characterize special directions of symmetry referred to, respectively, as "zigzag" and "armchair". A nanotube having a chiral vector set in the armchair direction of FIG. 6 (i.e., having a chiral angle equal to zero) is defined as "armchair nanotube". A nanotube having a chiral vector set in the zigzag direction of FIG. 6 (i.e., having a chiral angle equal to 30°) is defined as "zigzag nanotube". The armchair and zigzag nanotubes are also referred to as nonchiral nanotubes. Instead, the nanotubes having a chiral vector characterized by an chiral angle $\phi$ between 0° and 30° are referred to as chiral nanotubes. The chirality conditions the conductance of the nanotube, its density, the reticular structure, and other properties. The chiral indices may, in principle, be obtained experimentally by measuring the chiral angle $\phi$ and the diameter d of the nanotube with a transmission electron microscope (TEM) or with a scanning tunneling microscope (STM).

In addition, according to the values of the chiral indices n and m, the chiral nanotubes may be semiconductors or metallic. In fact, chiral nanotubes that satisfy the following relation:

$$n-m=3l, l=0, 1, 2, \ldots$$

are metallic and hence conductors. All the others present non-zero bandgap and, consequently, behave as semiconductors.

The fundamental bandgap of a semiconductor carbon nanotube depends upon the diameter d of the nanotube, according to the following relation:

$$E_{gap} = 2y_0 a_{cc}/d$$

where $y_0$ is the binding energy of the carbon atoms, and $a_{cc}$ is the distance between two neighboring carbon atoms.

Consequently, by appropriately modifying the chirality of the nanotube and hence its diameter, it is possible to modulate its bandgap. The two different geometrical structures of the molecule (i.e., the initial one and the modified one) can thus represent two stable states.

Figure 7:
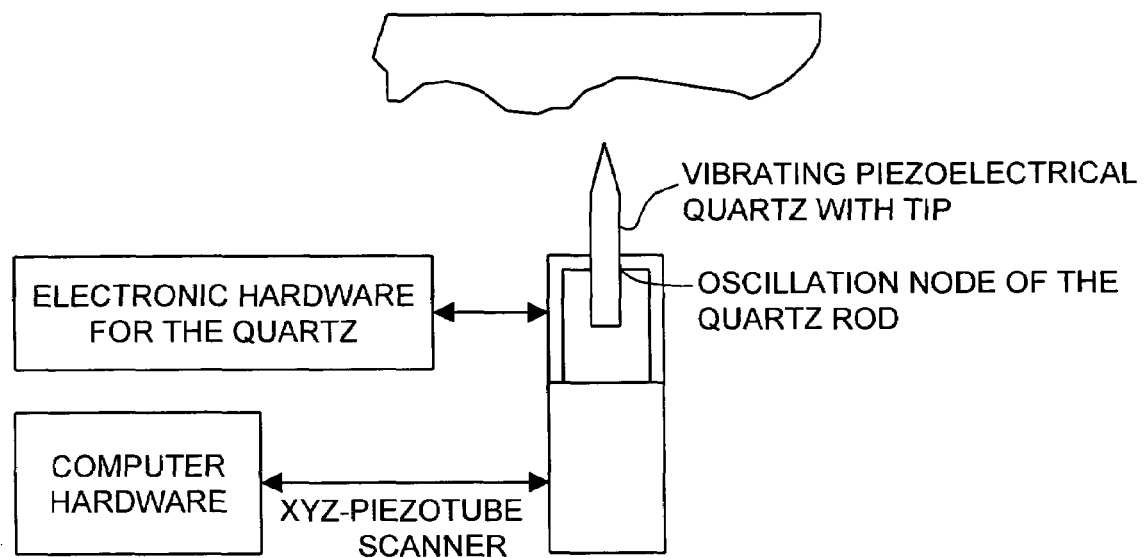
FIG. 7 shows the diagram of an atomic force microscope.
Figure 8:
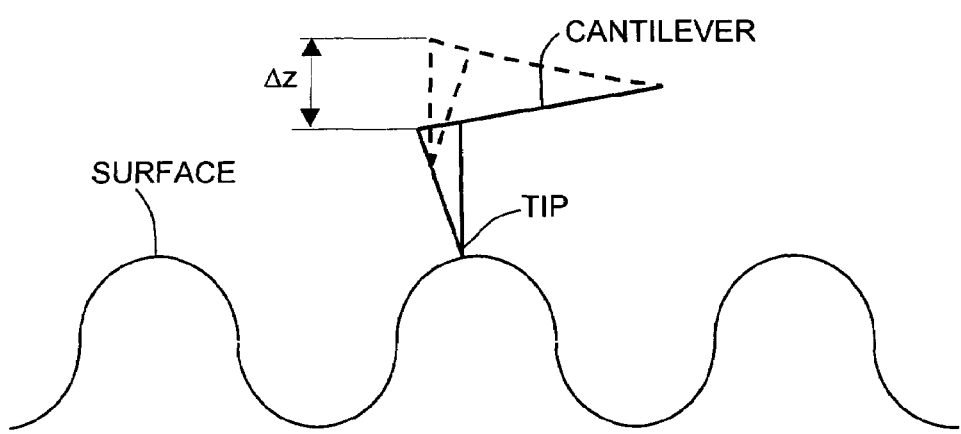
FIG. 8 shows the working principle of an atomic force microscope.

The geometrical structure of a carbon nanotube can be modified using an atomic force microscope (AFM), the working tips of which can be made of silicon (possibly doped), $Si_3N_4$, or using the nanotubes themselves, with radiuses of curvature of the order of a few tens of nanometres. An atomic force microscope and its working principle are illustrated, respectively, in FIGS. 7 and 8. In practice, a very sharp tip mounted on a cantilever is made to "slide" over the surface of the specimen to be analysed. The forces of interaction between the tip and the atoms of the surface of the specimen under examination, which is of the order of nN, cause a deflection of the cantilever on which the tip is mounted. To a change of shape of the surface of the specimen under examination there corresponds a change in the deflection of the cantilever, which is detected by the position of a laser beam. In the case where the specimen under examination is a carbon nanotube, it is possible, using a rigid cantilever, to exploit the forces of interaction between the tip and the atoms of the nanotube in order to modify the geometry of the nanotube itself.

Figure 9:
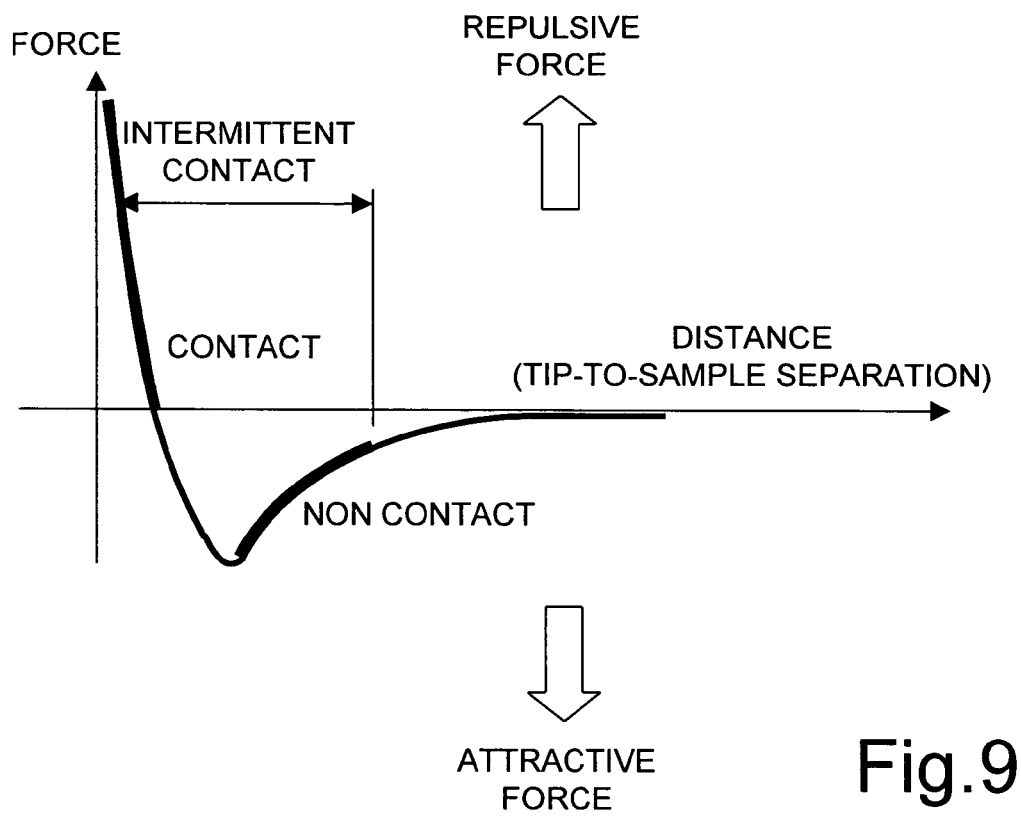
FIG. 9 shows the graph of the force exerted by an atomic force microscope as a function of the distance between the microscope tip and the specimen under examination.

In particular, the forces of interaction between the tip and the atoms of the specimen arise from the interatomic force, known as Van der Waals force. The graph appearing in FIG. 9 shows the plot of the Van der Waals force as a function of the distance between the tip and the specimen.

This method for modifying the geometry of the nanotube is used in two different operating modes: a contact mode, in which the ionic forces are prevalent, and a non-contact mode, in which the Van der Waals forces are prevalent. In the contact mode, the cantilever is kept at a few angstrom from the surface of the specimen, and the interatomic force between the cantilever and the specimen is repulsive, whereas, in the non-contact mode, the cantilever is kept at a few tens of angstrom from the surface, and the interatomic force between the cantilever and the specimen is attractive.

Figure 10A:
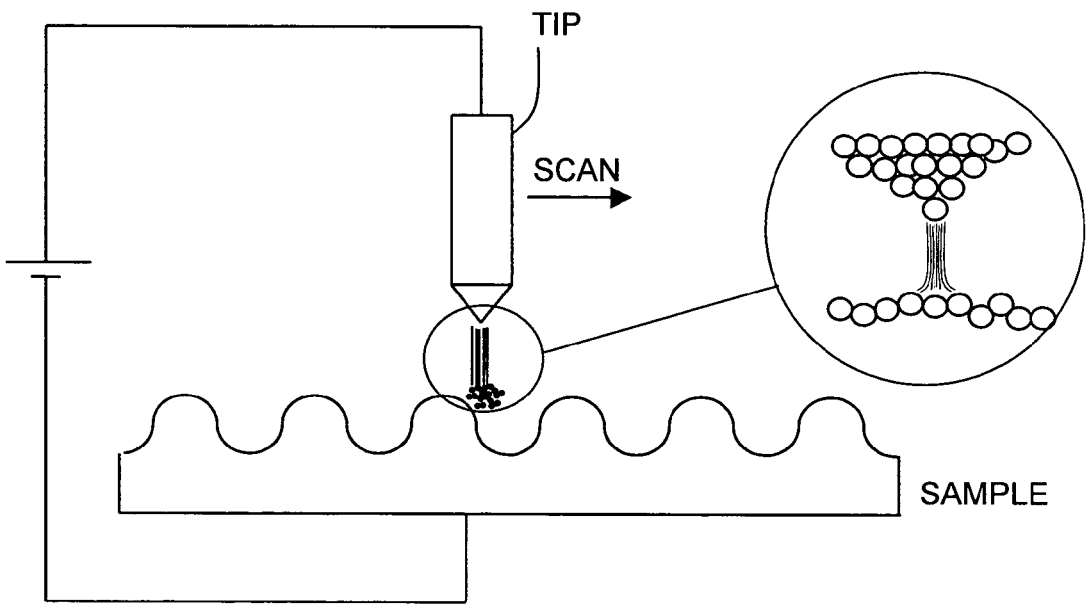
FIG. 10a shows the diagram of a scanning tunnelling microscope.
Figure 10B:
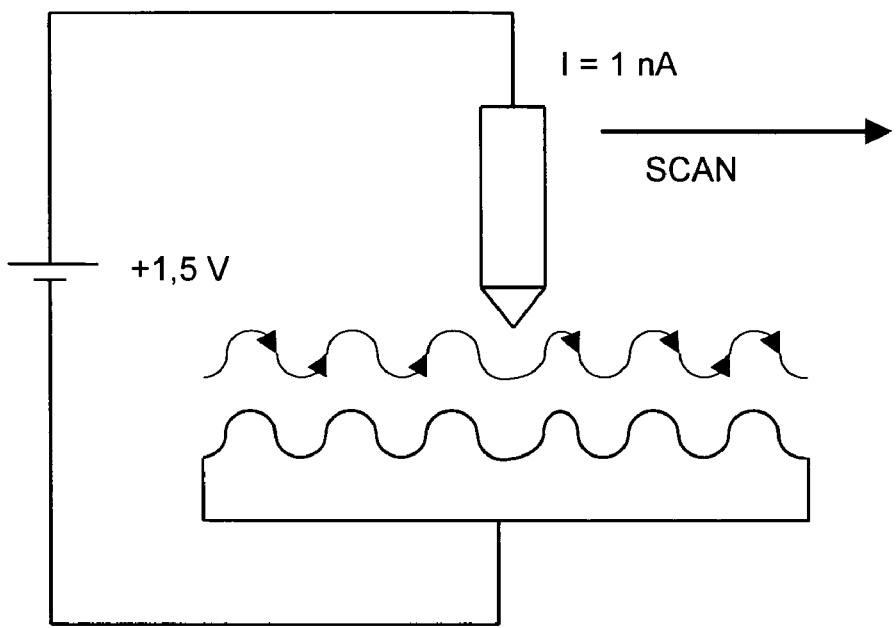
FIG. 10b shows the constant current operation mode of a scanning tunnelling microscope.
Figure 10C:
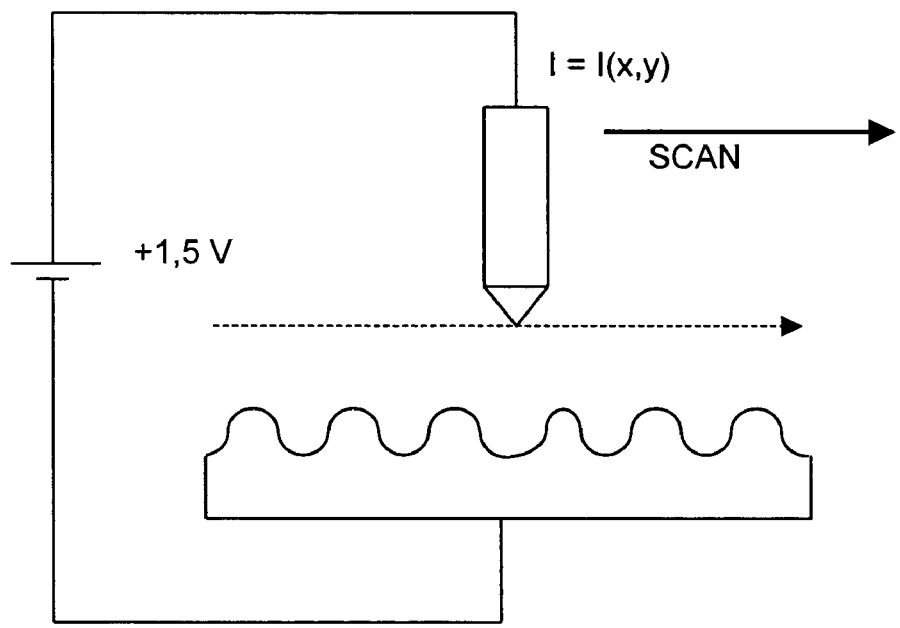
FIG. 10c shows the constant height operation mode of a scanning tunnelling microscope.

As an alternative to the atomic force microscope, it is possible to use a scanning tunnelling microscope, as illustrated in FIG. 10a, by means of which the modifications on the geometry of the nanotubes are induced by causing weak currents to flow between the tip and the surface of the specimen. In this case, two operating modes are possible: the constant current mode (FIG. 10b) and the constant tip height mode (FIG. 10c). This type of microscope is based upon electrostatic interactions between the tip and the surface of the specimen and employs platinum-iridium tips.

Using the microscopes mentioned above, modifications between the bandgaps of the individual molecules are induced statistically, obtaining, as overall effect, modifications of the state of the memory cell with a very high number of degrees of freedom.

Figure 11:
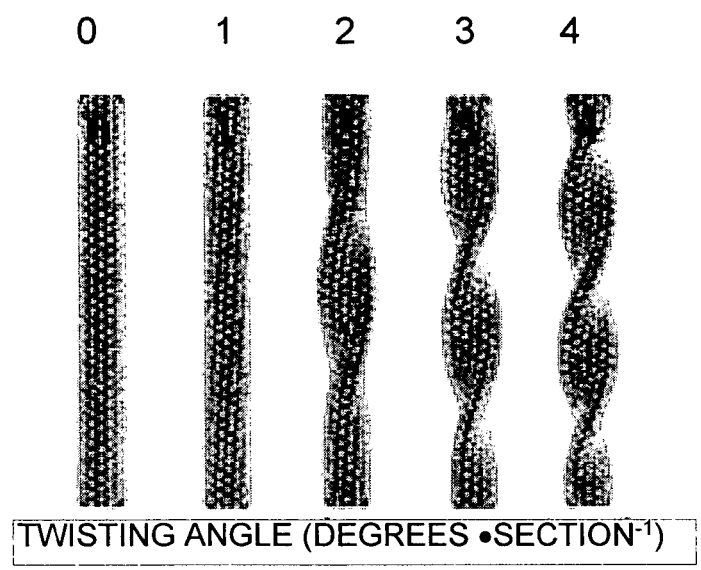
FIG. 11 shows the effects of twisting on the structure of a nanotube.

In particular, it is possible to think of three different types of modifications induced on the individual molecule, or on the nanotube:

Twisting of the nanotube (FIG. 11), in which the bandgap of the individual molecule varies according to the variations in its chirality.

Figure 12:
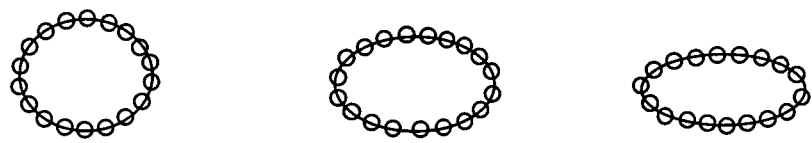
FIG. 12 shows the effects of squeezing, on the structure of a nanotube.

Squeezing of the nanotube (FIG. 12), in which the section of the nanotube is modified according to the force per unit length applied according to the relation:

$$\frac{F}{1} = (\pi a \rho) \frac{1}{d^2}$$

where $\rho$ is the superficial atomic density of the flattened tube, l is the axial length, and d is the vertical dimension of the tube section.

The effect of squeezing is represented by the following dimensionless quantity referred to as shape factor:

$$\eta = \frac{(D_0 - d)}{D_0}$$

where $D_o$ is the initial diameter of the nanotube. The bandgap of the individual nanotube varies, as the shape factor $\eta$ varies.

Figure 13:
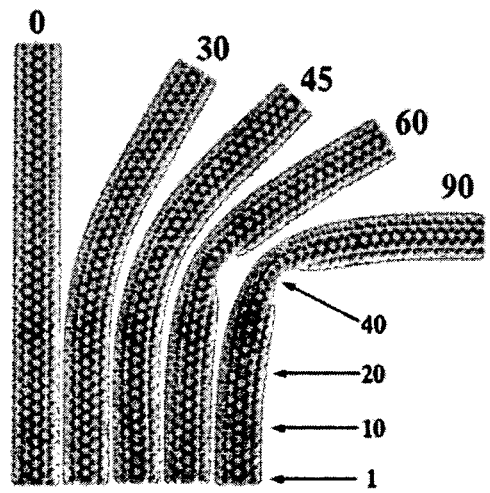
FIG. 13 shows the effects of bending on the structure of a nanotube.

Bending of the nanotube (FIG. 13). The local density of states is modified as the angle of curvature of the molecule varies.

The different types of deformation of the carbon nanotubes may present a behavior of an elastic type or of a plastic type (stress lower at the limits of failure), according to the energy applied by means of the atomic force microscope or the scanning tunnelling microscope.

Figure 14:
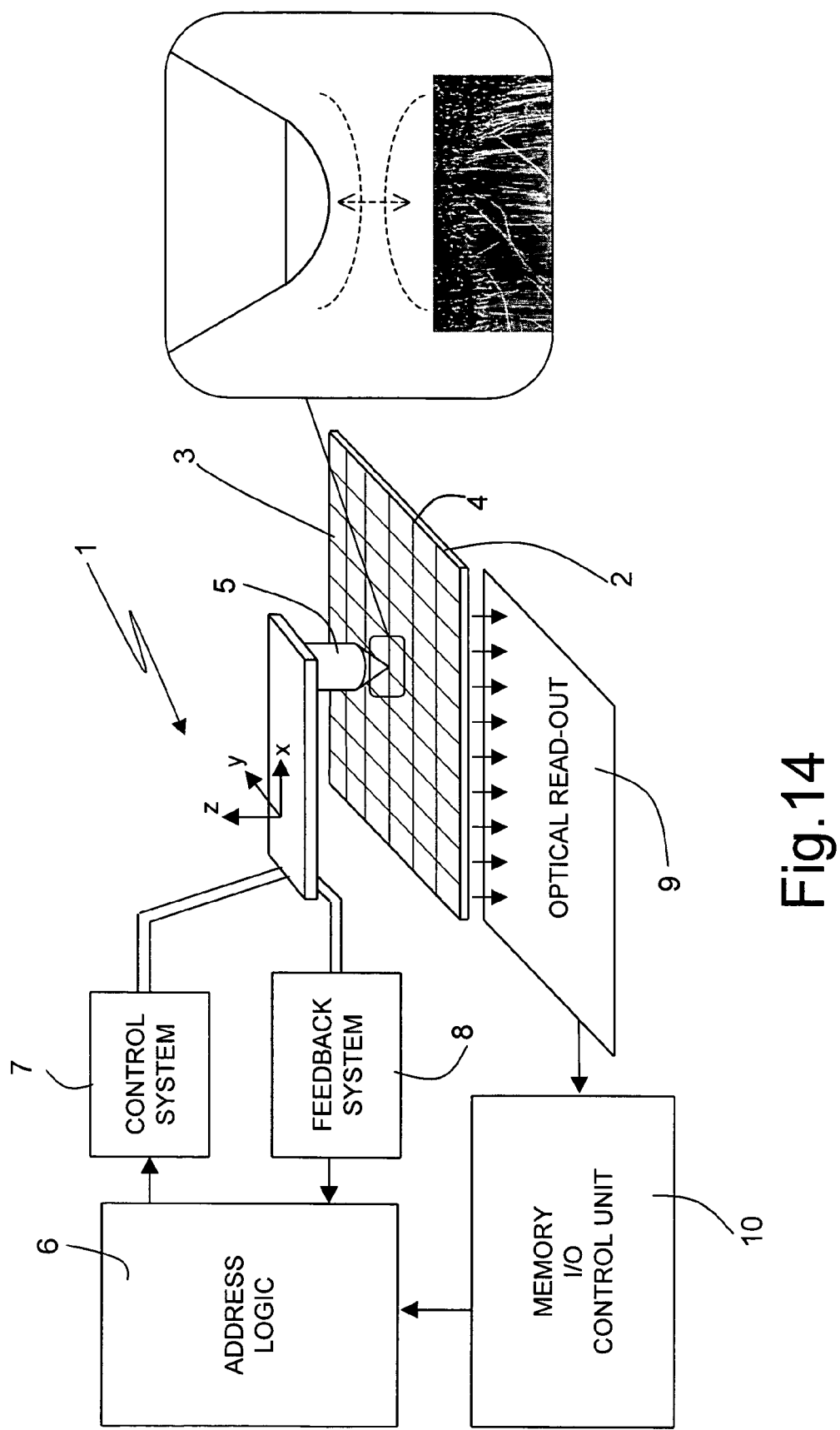
FIG. 14 shows a schematic circuit diagram of a molecular memory according to an embodiment of the invention.

FIG. 14 illustrates an optically readable memory device according to an embodiment of the invention.

In particular, according to what is shown in FIG. 14, the memory device, designated as a whole by 1, comprises a molecular nonvolatile memory obtained using carbon nanotubes, and a system for writing data into the molecular memory.

The molecular memory, designated as a whole by 2, comprises a substrate 3, for example made of silicon or glass, on which a thin layer 4 of carbon nanotubes is arranged. In particular, the carbon nanotubes 4 are arranged on the substrate 3 in such a way as to form a memory cell array. The arrangement of the nanotubes on the substrate depends upon the technique with which the nanotubes are synthesised. In particular, the carbon nanotubes may be synthesised by means of an arc discharge, laser vaporization in an oven, or by catalytic growth by means of chemical vapor deposition (CVD). Using the first two techniques, a "soot" of nanotubes is obtained randomly arranged on the substrate. Instead, with the chemical vapor deposition technique, it is possible to obtain a set of vertically aligned nanotubes. Consequently, according to the technique of synthesis employed, the individual memory cell may be formed by a single nanotube or a set of nanotubes randomly arranged on the substrate or vertically arranged on the substrate. As a result, a memory cell may be a single nanotube or a set of nanotubes, arranged in a definite region, according to the specific read/write and hence addressing system.

A nanoactuator 5, for example, the tip of an atomic force microscope or of a scanning tunnelling microscope, is kept in constant or intermittent contact with the nanotube layer 4, in such a way that, on account of the forces of interaction at a molecular level, as described above, which are exerted between the nanoactuator 5 and the nanotube layer 4, modifications are induced in the structure of each memory cell. These modifications are such that, according to the modifications induced, the data are written on the memory array.

As mentioned previously, the tip of the atomic force microscope may be made also using individual carbon nanotubes; this would guarantee a level of accuracy compatible with the nanometric scales involved.

The different types of deformation of the nanotubes described above may present an elastic behavior or a plastic behavior (lower stress at the limits of failure), according to the energy applied by means of an atomic force microscope or a scanning tunnelling microscope.

For the purposes of operation of the memory as a nonvolatile memory unit, modifications are induced in the state of the individual nanotubes, by applying a stress state in the region of plastic deformation (i.e., prior to the critical failure point).

The above configuration of the molecular memory is suitable for a simpler practical embodiment as compared to other configurations that require manipulation of the individual molecule, in that, as has already been said regarding the limits of the prior art solutions, the products of the proresses of synthesis are usually bundles of carbon nanotubes. In fact as mentioned above, carbon nanotubes are synthesised by arc discharge, laser vaporization in an oven, or catalytic growth by chemical vapor deposition, and in all three cases the product of the process is represented by a bundle of nanotubes differently arranged according to the manufacture process adopted and the corresponding parameters.

The operating principle of the memory device according to an embodiment of the invention applies to all the cases referred to above and avoids the need for extraction of the individual molecule, which would involve additional steps of separation and manipulation thereof, which are extremely delicate, as well as being costly.

With reference again to FIG. 14, time nanoactuator 5 is connected to a nanometric precision micropositioning block 7 connected to an addressing block 6 for addressing the individual memory cell to be written, and to a feedback control block 8, which has the purpose of driving the nanoactuator 5 horizontally and vertically according to the signals supplied by the blocks-6 and 8. The block 8, in fact, determines the energy necessary for the nanoactuator 5 to exert the action of local modification of the state of the individual cell of the nanotube array 4. Likewise provided is an optical reading block 9 for optically reading the outputs of the memory 2, formed by, for example, of optical sensors, such as photomultipliers, charge coupled devices (CCDs), CMOS sensors, or of a set of optical lenses, and a block 10, connected between the block 9 and the block 6, Operating as control unit for controlling the inputs and outputs of the memory.

Block 10, in fact, receives at its input the data supplied by block 9, and addresses the data at its output in block 6. Consequently blocks 6, 7, 8 and 10 constitute a control logic, which supplies the inputs and the outputs of the memory and the logic addresses for driving the nanoactuator and the reading system, represented by block 9.

The working principle of the memory illustrated in FIG. 14 is described in what follows according to an embodiment of the invention. The write operation is performed, by means of the nanoactuator 5, in such a way as to bring about a substantial modification, with respect to a given wavelength, in the transmissivity of each individual memory cell forming the nanotube array 4.

The positioning of the nanoactuator 5 is done by means of the nanometric precision micropositioning block 7, which is driven, on the horizontal plane, by the addressing block 6 for addressing the individual memory cell to be written, and vertically by the fedback control block 8. As has been mentioned above, the said block 8 determines the energy necessary for the nanoactuator 5 to exert the action of local modification of the state of the individual cell of the nanotube array 4. The said state coincides with the logic state "0" or with the logic state "1", according to the bandgap energy Eg. For example, the geometry of a nanotube with an energy Eg of 0.4 eV, this state representing the logic "0", can be modified in order to have an energy Eg of 0.7 eV, this state representing the logic "1".

The read operation is carried out using a photosensitive system comprising a laser array and a detector array, by means of which it is possible to read the content of the memory, by optical means, in the way described hereinafter.

The illuminated cells of the array encode the binary state "1", whilst the ones not illuminated encode the binary state "0". In order to enable reading, one arranges the nanotube array 4 on a solid support transparent to the wavelength $\lambda$ of the radiation used, which will thus render possible transmission of the light and hence reading of the cell.

It is possible to carry out an optical reading by applying a laser radiation with a wavelength $\lambda$ to the nanotube, which satisfies the following relation:

$$Eg_1(=0.7)<E<Eg_0(=0.4)$$

The nanotubes with Eg=0.7 eV are transparent to the radiation, whilst those with Eg=0.4 eV absorb the radiation.

Once the wavelength of the laser, which is used for reading the memory, has been fixed, it is possible to use as logic state "0" the one corresponding to a low value of transmissivity and, hence, to a high absorption of the radiation. Instead, a high value of transmissivity encodes the logic state "1".

Using, as nanoactuator, the tip of an atomic force microscope or a scanning tunnelling microscope, it is possible to modify the geometrical configuration of the nanotube array so as to obtain an adequate value of overall transmissivity according to the corresponding encoding.

For instance, if the geometry of a single semiconductor nanotube, characterized by a given value $Eg_0$ of the bandgap and by a critical wavelength $\lambda c_0$, is modified in a stable way (by means of a tip of an AFM or STM microscope), a modification is also induced in the bandgap. If the structural modification is such as to induce a value of the bandgap $Eg_1$ (critical wavelength $\lambda c_1$), a laser light with a wavelength $\lambda<\lambda c_0(E>Eg_0)$, which impinges on the nanotube prior to deformation, is absorbed because the energy associated with the photons is higher than the bandgap. Consequently, since reflectivity is a factor that does not depend upon the structural deformations, to a high absorption there corresponds a low value of transmissivity. When, instead, the radiation impinges upon the modified nanotube $\lambda>\lambda c_1$, and hence $E<Eg_1$), it is not absorbed because the photons have an energy lower than the bandgap. In this case, then, there will be a high value of transmissivity. For any set of nanotubes, the overall transmissivity of the set may be obtained as a statistical mean of the transmissivity of the individual nanotubes. The two values of transmissivity (high and low) of the set represent the two stable states of the individual memory cell.

Reading is performed by photodetectors, which generate a current proportional to the intensity of the incident radiation (called photogeneration current). As a result, a high current value corresponds to a high transmissivity value (logic state "1"), whilst a low current value corresponds to a low transmissivity value (logic state "0").

In addition, by using an AFM, it is possible to modify, in a controlled way, the geometry of the molecules, exploiting the Van der Waals interactions between the AFM and the nanotubes, on the one hand, and the same interactions existing between the nanotubes and the substrate, on the other.

It is sufficient to recall that the system of manipulation is based upon the general principle of the Van der Waals interactions and, consequently, does not necessarily require complex and costly equipment, such as commercial AFMs, but rather may be simplified also by adopting nanomanufacture techniques in the form of a nanoelectromechanical integrated system. For instance, as mentioned previously, the very tip of the AFM can be made also using individual carbon nanotubes, which would guarantee a level of accuracy compatible with the nanometric scales involved.

The speed and reliability of the memory in the read phase depends to a large extent upon the characteristics (sensitivity, frequency response, size, etc.) of the detector array. It is known that the silicon active pixel arrays obtained using CMOS technology and consisting of pn photodiodes integrated with sense amplifiers and flip-flops, are fast, reliable and small-sized devices. They enable transformation of the charge signal produced by a photon in the detector into a voltage signal that is amplified and stored in a flip-flop. At present, silicon technology is able to provide smart pixels, i.e., ones that integrate the detection and amplification part with dimensions that vary according to the optical sensing technology adopted. The fact that they are integrated is important for guaranteeing a high efficiency at a working frequency not affected by parasitic capacitances which would derive from the package of discrete components.

As an alternative, it is possible to obtain an optical coupling by means of convergent lenses. In fact, the CMOS-sensor reading system could prove limiting as compared to the density achievable for the molecular memory in terms of number of sites corresponding to individual memory cells.

The memory according to an embodiment of the invention presents considerable advantages as compared to traditional memories. Mainly, a high density of memory cells is obtained, i.e., a larger storage capacity (up to $10^{10}$ bits/mm$^2$), due to the typical dimensions of the memory cells, which are of the order of 10 nm.

A further advantage is represented by the capacity of maintaining the information stored in memory unaltered over time, since each datum stored corresponds to a geometrical-structural situation of the nanotube, which is not deteriorated as a result of time or of environmental parameters, leakage currents, etc.

Finally, no problem of wiring is present, in so far as the operations of access during reading and writing are based upon physical principles other than the transportation of electric charge, and ones which are more easily compatible with the size scales involved.

What is claimed is:

1. An optically readable memory device, the memory device comprising:

a molecular memory obtained using carbon nanotubes, the geometrical configuration of which encodes information; and means for modifying the geometrical configuration of said carbon nanotubes, according to the information to be stored, wherein said modification means comprise a nanoactuator and driving means for driving said nanoactuator, characterized in that said driving means comprise addressing means for addressing a single memory cell to be written; micropositioning means for positioning said nanoactuator; and feedback control means for controlling said nanoactuator; said memory device further comprising optical reading means for reading the output data of said memory, and control means for controlling the input and output data of said memory.

2. The memory device according to claim 1, wherein said optical reading means comprise optical sensors.

3. The memory device according to claim 2, wherein said optical sensors are photomultipliers.

4. The memory device according to claim 2, wherein said optical sensors are charge coupled devices.

5. The memory device according to claim 2, wherein said optical sensors are CMOS sensors.

6. The memory device according to claim 1, wherein said optical reading means comprise optical lenses.

7. A method for storing information in an optically readable memory device comprising a molecular memory obtained using carbon nanotubes, the method comprising:

modifying the geometrical configuration of said carbon nanotubes by means of a nanoactuator according to the information to be stored;

encoding said information by means of said geometrical configuration of said carbon nanotubes;

addressing said nanoactuator on a single memory cell to be written;

micropositioning said nanoactuator on said memory cell;

feedback controlling said nanoactuator;

optically reading the output data of said memory; and controlling the input and output feedback of said memory.

8. The storage method according to claim 7, wherein said optically reading the output data of said memory is carried out by means of optical sensors.

9. The storage method according to claim 8, wherein said optical sensors are photomultipliers.

10. The storage method according to claim 8, wherein said optical sensors are charge coupled devices.

11. The storage method according to claim 8, wherein said optical sensors are CMOS sensors.

12. The storage method according to claim 8, wherein said optical reading of the output data of said memory is carried out using optical lenses.

13. A memory, comprising:

a memory cell comprising nanotubes and operable to store a data value related to the bandgap energy of the cell, wherein the bandgap energy of the cell is the bandgap energy of a majority of the nanotubes;

a nanoactuator operable to write the data value to the memory cell; and an optical energy sensor operable to read the data value from the memory cell.

14. A memory, comprising:

a memory cell comprising nanotubes and operable to store a data value related to the bandgap energy of the cell, wherein the bandgap energy of the cell is related to the shapes of the majority of the nanotubes;

a nanoactuator operable to write the data value to the memory cell; and an optical energy sensor operable to read the data value from the memory cell.

* * * * *